United States Patent
McQuirk et al.

(10) Patent No.: US 10,509,428 B1
(45) Date of Patent: Dec. 17, 2019

(54) CIRCUIT WITH MULTIPLE VOLTAGE SCALING POWER SWITCHES

(71) Applicant: NXP USA, INC., Austin, TX (US)

(72) Inventors: Dale John McQuirk, Austin, TX (US); Miten H. Nagda, Bee Cave, TX (US); Nidhi Chaudhry, Austin, TX (US); James Robert Feddeler, Lake Village, IN (US); Stefano Pietri, Austin, TX (US); Simon Gallimore, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/397,198

(22) Filed: Apr. 29, 2019

(51) Int. Cl.
*G05F 1/575* (2006.01)
*G05F 1/59* (2006.01)
*G11C 5/14* (2006.01)
*G11C 11/4063* (2006.01)

(52) U.S. Cl.
CPC ............. *G05F 1/575* (2013.01); *G05F 1/59* (2013.01); *G11C 5/147* (2013.01); *G11C 11/4063* (2013.01)

(58) Field of Classification Search
CPC . G05F 1/56; G05F 1/563; G05F 1/565; G05F 1/59; G05F 1/595; G11C 5/14; G11C 5/147; G11C 5/406; G11C 5/4063
See application file for complete search history.

(56) References Cited

U.S. PATENT DOCUMENTS

| 5,717,319 | A | 2/1998 | Jokinen | |
|---|---|---|---|---|
| 6,548,991 | B1 | 4/2003 | Maksimovic et al. | |
| 7,170,265 | B2 | 1/2007 | Whittaker | |
| 7,479,768 | B1 * | 1/2009 | Salmi | H02M 3/157 323/224 |
| 7,730,340 | B2 | 6/2010 | Hu et al. | |
| 7,788,508 | B1 * | 8/2010 | Salmi | G06F 1/3203 713/300 |
| 8,370,654 | B1 * | 2/2013 | Hasko | G06F 1/26 713/300 |
| 2012/0293195 | A1 * | 11/2012 | Bourstein | G01R 31/31721 324/750.01 |
| 2014/0217825 | A1 * | 8/2014 | Chaudhry | H03K 5/2481 307/43 |
| 2015/0349631 | A1 * | 12/2015 | Potanin | G05B 13/042 323/282 |

* cited by examiner

Primary Examiner — Matthew V Nguyen
(74) Attorney, Agent, or Firm — David G. Dolezal; Joanna Geld

(57) ABSTRACT

A first voltage scaling power switch is coupled to a first power supply terminal for providing power to a first circuit portion, and a second voltage scaling power switch is coupled between the first power supply terminal providing power to a second circuit portion. A common power rail is coupled the first and second power input nodes during respective voltage scaling modes of the first and second circuit portions. A feedback circuit coupled to the common power rail provides a feedback signal to a control input of the first voltage scaling power switch to regulate a voltage provided by the first power switch, and to a control input of the second voltage scaling power switch to regulate a voltage provided by the second voltage scaling power switch.

20 Claims, 3 Drawing Sheets

CIRCUIT WITH MULTIPLE VOLTAGE SCALING POWER SWITCHES

BACKGROUND OF THE INVENTION

Field of the Invention

This invention relates to an integrated circuit with multiple voltage scaling power switches.

Background

The circuitry of an integrated circuit may be divided up into different portions such as different power domains in which power can be selectively controllable to each circuit portion.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As disclosed herein, power regulating circuitry for an integrated circuit includes multiple voltage scaling power switches, each for providing power for powering a portion of an integrated circuit. Each of the voltage scaling power switches is responsive to an output of a feedback circuit when operating in a voltage scaling mode. The feedback circuit compares the voltage of a common power rail with a reference voltage in providing its output. The power input terminals of the powered circuit portions are coupled to the common rail when operating in a voltage scaling mode.

In some embodiments, the powered portions are portions of an integrated circuit that are powered to retain data (in some cases at a lower voltage than in a normal operating mode) when at least some part of the integrated circuit is in a low power mode. Other circuit portions of the integrated circuit can be powered down in the low power mode, while still others may be at full power. When a power switch is operating in a voltage scaling mode, the voltage provided by one current electrode of the voltage scaling power switch is reduced from a voltage provided to the current electrode of the switch.

Controlling multiple voltage scaling power switches with a common feedback signal may reduce the size of the power regulating circuitry in that each voltage scaling power switch does not need its own voltage feedback circuitry. Furthermore, controlling all the power switches in voltage scaling mode by connecting them in parallel using single feedback amplifier may simplify the challenges of designing the feedback amplifier (e.g. stability across load current variation) by balancing out the load current variation across multiple selected voltage scaling switches. Furthermore, coupling the supply terminals of the circuit portions that are in a voltage scaling mode allows for a voltage equalization of the circuit portions in the voltage scaling mode. In addition, the effective width of all of the voltage scaling power switches can be scaled according to the amount of circuitry in a voltage scaling mode at any one time.

Figure 1:
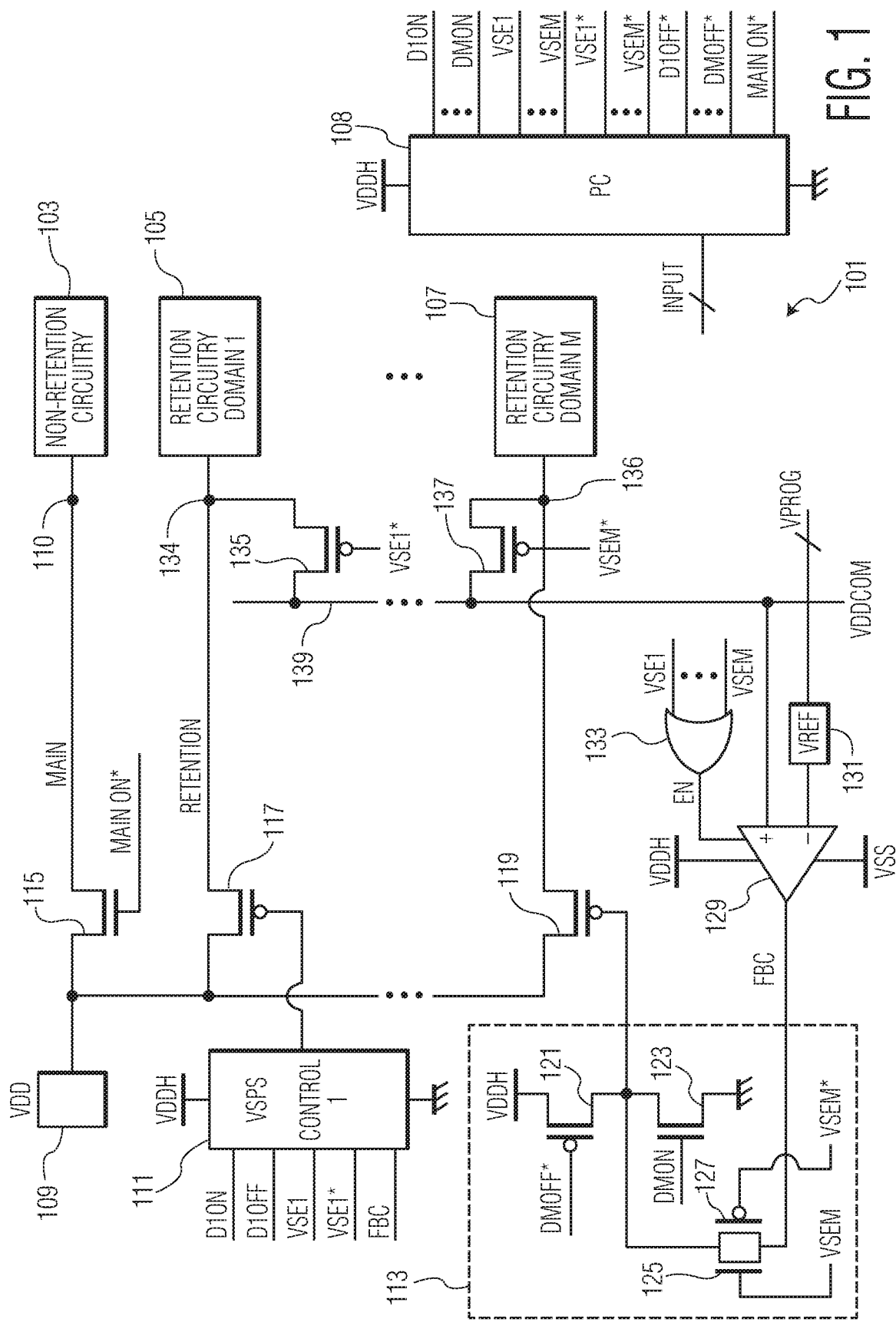
FIG. 1 is a circuit diagram of an integrated circuit according to one embodiment of the present invention.

FIG. 1 is a circuit diagram of an integrated circuit according to one embodiment of the present invention. The circuitry for performing the functions of integrated circuit 101 is represented as non-retention circuitry 103, retention circuitry domain 1 105, and retention circuitry domain M 107. In one embodiment, the non-retention circuitry 103 represents circuitry of integrated circuit 101 that is fully powered at VDD in a normal operating, full voltage mode to perform the functions of integrated circuit 101 and is powered down in a low power mode or in an off mode. The retention circuitry domain 1 105 and retention circuitry domain M 107 represent circuitry that can selectively be powered at VDD (e.g. 1.1 V) in a full voltage mode, powered at a lower, scaled voltage (e.g. 0.7 V or other programmable voltage) in a voltage scaling power mode to retain data or a signal state in a low powered mode of the integrated circuit, or can powered down in an off mode.

In some embodiments, integrated circuit 101 includes processing and memory circuitry for performing processing operations and storing data. In one embodiment, the memory cells (e.g. SRAM cells) of an array are located in one of the retention circuitry power domains 105 and 107 where the data states of the cells are maintained in a voltage scaling mode when at least a portion of the integrated circuit is in a low power mode. The peripherals of the memory circuit and the processing circuitry are located in non-retention circuitry 103, which is powered off in a low power mode. Some embodiments include multiple non-retention circuitry like circuitry 103, where each can be individually powered in a full power mode or powered off. However, integrated circuit 101 may include other types of circuitry (e.g. programmable logic, sensors, stand-alone memories) that may include other types of circuits (e.g. flip-flops) that retain data in a low power mode and would be located in one of the retention circuitry domains.

Integrated circuit 101 includes an external power supply terminal (e.g. VDD pad 109) for receiving power from an external power supply at a supply voltage (e.g. 1.1 volts). Circuit 101 includes a main power switch 115 for selectively supplying power from pad 109 to non-retention circuitry 103 in a full voltage mode when power switch 115 is closed in response to an MAIN ON* signal being at an asserted low voltage state. When the MAIN ON* signal is at a high voltage state, circuitry 103 is off. In some embodiments, circuit 101 may include multiple non-retention circuitry portions similar to circuitry 103 where the power to each of the portions is selectively controlled by one of a number of power switches. In some embodiments, all of the circuitry of integrated circuit 101 may be powered at a scaled voltage in a low power mode. In some embodiments, voltage VDD may be supplied by an output terminal of a voltage regulator that is internal to integrated circuit 101.

Integrated circuit 101 includes a number of voltage scaling power switches (117 and 119) which supply power to retention circuitry domains (105 and 107, respectively) which may be powered in a full power mode, an off mode, or in voltage scaling mode as needed. Although FIG. 1 shows two voltage scaling power switches (117 and 119) and two corresponding retention circuitry domains (105 and 107), other embodiments may include a greater number of each. In the embodiment shown, voltage scaling power switches 117 and 119 each are implemented with a PFET, but may be implemented with other types of power switches in other embodiments (e.g. an NFET). The control inputs (gate of a FET) of power switches 117 and 119 are controlled by voltage scaling power switch (VSPS) control circuits 111 and 113, respectively. Each control circuit 111 and 113 receives a number of control signals from a power controller 108 and a feed-back signal FBC from feed-back amplifier 129 for selectively placing each domain in one of three operational modes: 1) full voltage, 2) voltage scaling, and 3) off.

In the full voltage mode, a VSPS control circuit (111) provides a low voltage (e.g. ground) to the control input of its corresponding voltage scaling power switch (117) to place the switch in a fully on state where the corresponding retention circuitry domain (105) receives power at the voltage of VDD (e.g. 1.1V). In the off mode, the VSPS control circuit (111) provides a high voltage value (VDDH) to make the power switch (117) non-conductive to turn off the circuitry of a domain (105).

In a voltage scaling mode according to one embodiment, a VSPS control circuit (111) provides a voltage (between VDDH and ground) that operates the power switch (117) in a saturation region of the transistor to scale the voltage provided to a domain (105) to a particular voltage that is less than VDD.

In the embodiment shown, the particular voltage that the power supply input is scaled to is set by a voltage reference circuit (VREF) 131 having an output connected to the non-inverting input of feedback amplifier 129. The output voltage of signal FBC of amplifier 129 is set such the voltage provided by a voltage scaling power switch (117) will match VREF when its corresponding circuitry domain is in a voltage scaling mode. In the embodiment shown, VREF is programable by a digital VPROG signal (e.g. from a processor or a set of one-time programmable devices not shown). However, in other embodiments, VREF may be a fixed value. In some embodiments, VREF circuit 131 includes a band gap reference circuit. In other embodiments, VREF circuit 131 includes a capacitor (not shown) that holds a charge wherein the voltage charging circuit is periodically turned on to charge the capacitor to the reference voltage.

FIG. 1 shows the circuitry of VSPS control circuit 113. VSPS control circuit 111 has similar circuitry. When domain 107 is in a full voltage mode and receiving power at voltage VDD from switch 119, NFET transistor 123 is fully conductive in response to an asserted DMON signal from controller 108 being at a high voltage value (VDDH) to pull the gate of switch 119 to a low voltage value to make switch 119 fully conductive (operating in a linear mode). During a full voltage mode, signal DMOFF* is at a non-asserted high voltage (VDDH) such that PFET transistor 121 is non-conductive. Also, in the full voltage mode, the VSEM and VSEM* signals are at non-asserted low and high voltages, respectively, to make the pass gate of transistors 125 and 127 non-conductive to isolate the gate of switch 119 from the feedback signal (FBC).

When domain 107 is in an off mode and receiving no power from switch 119, transistor 121 is fully conductive in response to an asserted DMOFF* signal from controller 108 being at a low voltage value (ground) to pull the gate of switch 119 to a high voltage value (VDDH) to make switch 119 non-conductive. During the off mode, signal DMON is at a non-asserted low voltage (ground) such that transistor 123 is non-conductive. Also, in an off mode, the VSEM and VSEM* signals are at non-asserted low and high voltages, respectively, to make the pass gate of transistors 125 and 127 non-conductive to isolate the gate of switch 119 from the feedback signal (FBC).

When domain 107 is in a voltage scaling mode, the VSEM and VSEM* signals are at asserted high and low voltages, respectively, to make the pass gate of transistors 125 and 127 conductive to make the gate of switch 119 responsive to the feedback signal (FBC), wherein the FBC signal controls the conductively of switch 119 to scale the voltage provided by switch 119 to a voltage set by VREF circuit 131. In some embodiments, switch 119 operates in a saturation mode when controlled by the FBC signal. In a voltage scaling mode, the DMOFF* signal is at a non-asserted high voltage (VDDH) to make transistor 121 non-conductive and the DMON signal is at a non-asserted low voltage (ground) to make transistor 123 non-conductive. In other embodiments, other types of switches may be used in place of a pass gate.

When a domain (105 or 107) is in a voltage scaling mode, a coupling transistor (135 or 137, respectively) is made conductive by an asserted low VSE signal (VSE1* or VSEM*, respectively) to connect the voltage supply terminal (134, 136, respectively) of the domain (105 or 107, respectively) in the voltage scaling mode to a common voltage rail 139. By connecting the voltage scaling power switches (117 and 119) in parallel using coupling transistors 135 and 137 respectively in voltage scaling mode, a single error amplifier can be used for multiple voltage scaled domains which enables the amplifier to regulate more evenly for wide variation of current loads in the individual voltage scaled domains. With some embodiments, the size of the power switches 117 and 119 are relatively large due to the current load requirements in full power mode with respect to the relatively low current drawn in a voltage scaling mode. Connecting all the power switches (e.g. 117 and 119) in parallel in a voltage scaling mode may assist in balancing out the current load which aids in amplifier stability even with the implementation of large power switches 117 and 119. In other embodiments, other types of switches can be used in place of coupling transistors 135 and 137.

When at least one of the domains is in a voltage scaling mode, amplifier 129 is enabled by the output of OR gate 133, which receives the VSE signals. When enabled, amplifier 129 provides at its output, the FBC signal at a voltage that drives the common bus (VDDCOM) to a voltage that equals VREF. When none of the VSE signals are asserted (indicating that none of the retention circuitry domains are in a voltage scaling mode), amplifier 129 is disabled to save power. However, circuit 101 may include other types of feedback circuits that have different configurations and/or operate in a different manner in other embodiments.

Because each of the VSPS switches (117, 119) includes a separate VSPS control circuit (111, 113) that receives separate control signals (D1ON, DMON, D1OFF*, DMOFF*, VSE1, VSEM, VSE1*, VSEM*), each of the power domains (105, 107) can be selectively placed in full voltage mode, an off mode, or a power scaling mode. Accordingly, different portions of integrated circuit 101 can be placed in low power modes or can be turned off while other domains are in full voltage modes.

Furthermore, because multiple power switches are controlled by one feedback circuit when in a voltage scaling mode, the amount of control circuitry utilized can be reduced. In addition, the "effective size" of the "cumulative power switch" providing the scaled voltage to the power domains can be selectively sized based on the amount of circuitry operating in a scaled voltage mode at any one time. For example, if both domains 105 and 107 are in a voltage scaling mode, the "effective width" of the "cumulative power switch" that provides the scaled voltage to the domains is switches 117 and 119 operating in parallel. However, if only one power domain is operating in a voltage scaling mode, then only one of switches 117 and 119 is operating in a saturation mode such that the "effective size" of the "cumulative voltage scaling power switch" is less in that less circuitry is operating in a voltage scaling mode.

In the embodiment shown, the voltage supplied to the VSPS control circuits 111 and 113, the feedback amplifier 129, and power controller 108 is VDDH, which in one embodiment, is higher (e.g. 1.8 volts) than VDD (e.g. 1.1 volts). In one embodiment, this higher voltage is utilized to ensure that the PFETs that implement the power switches 115, 117, and 119 are fully off with a more negative turn-off voltage when the D1OFF* and DMOFF* signals are asserted low and the MAIN ON* signal is at a non-asserted high voltage. In one embodiment, this higher voltage is provided by a charge pump (not shown) but may be provided by an external voltage source in other embodiments. In other embodiments, the VSPS control circuits, the power controller, and feedback circuits are supplied with VDD.

Figure 2:
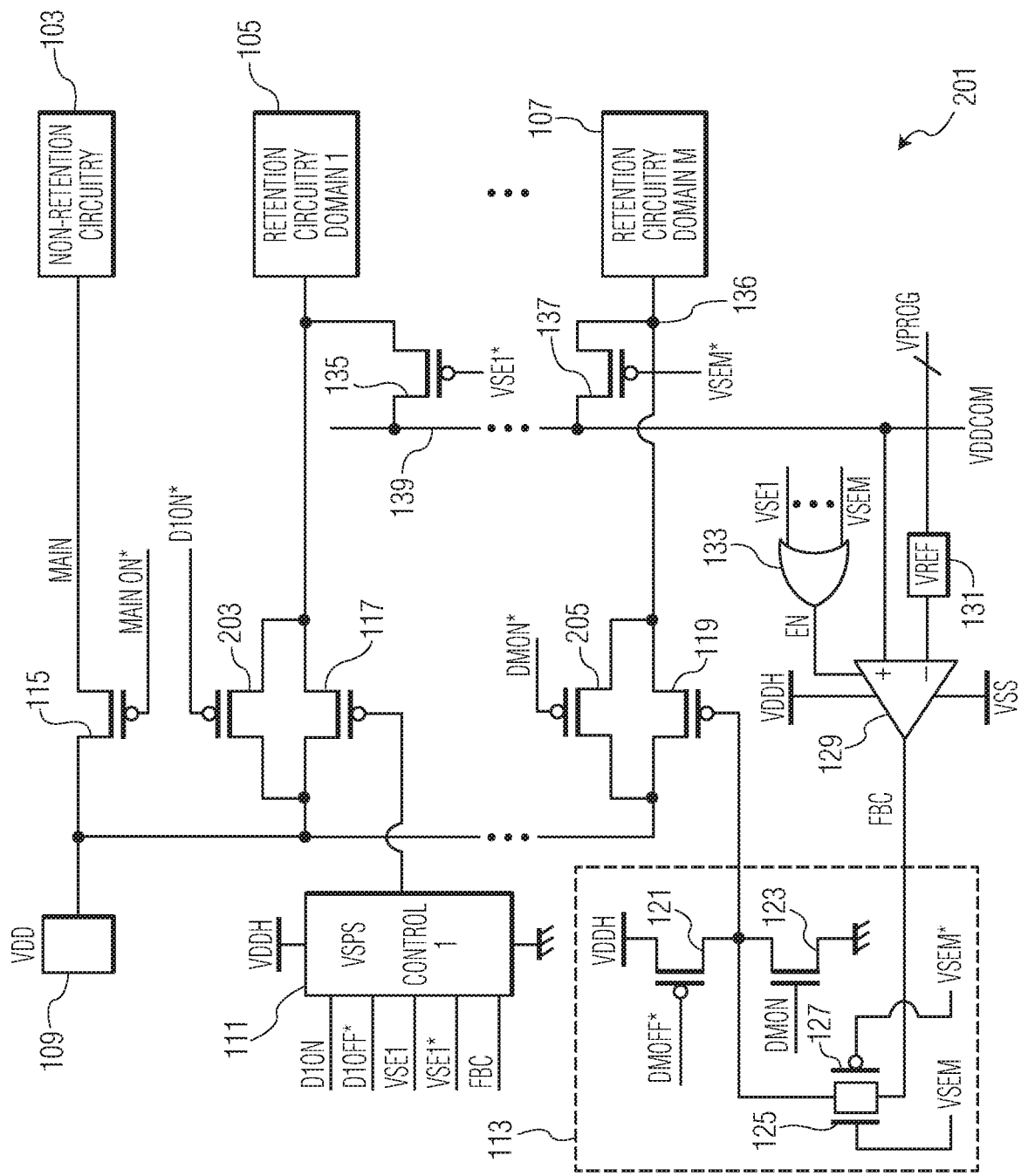
FIG. 2 is a circuit diagram of an integrated circuit according to another embodiment of the present invention.

FIG. 2 is a circuit diagram of an integrated circuit according to another embodiment of the present invention. The items in FIG. 2 having the same numbers are similar to the corresponding items in FIG. 1. Not shown in FIG. 2 is a power controller similar to power controller 108.

A major difference between integrated circuit 201 of FIG. 2 and integrated circuit 101 of FIG. 1 is that there is a power switch (203, 205) in parallel with each voltage scaling power switch (117, 119, respectively) in the embodiment of FIG. 2. The additional power switch (203, 205) is for supplying each retention circuitry domain (105, 107, respectively) with additional current during a full voltage mode. In the embodiment shown, power switch device 203 is controlled by an asserted low D1 ON* signal (from a power controller not shown) and power switch device 205 is controlled by an asserted low DMON* signal (from a power controller not shown). Each of signal D1 ON* and signal DMON* is asserted low when the corresponding circuitry domain is to be placed in a full voltage mode. In some embodiments, the use of an additional power switch for supplying power in a full voltage mode may allow for the voltage scaling power switch to be sized for a lower current usage of a low power, voltage scaling mode and not for a higher current usage of a full voltage mode. Accordingly, the voltage scaling power switch can be smaller to provide better voltage stability than with the embodiment of FIG. 1. In the embodiment shown, the voltage scaling power switches (117, 119) of FIG. 2 are also fully conductive in a full voltage mode. However, in other embodiments, the voltage scaling power switches could also be non-conductive during a full voltage mode.

Figure 3:
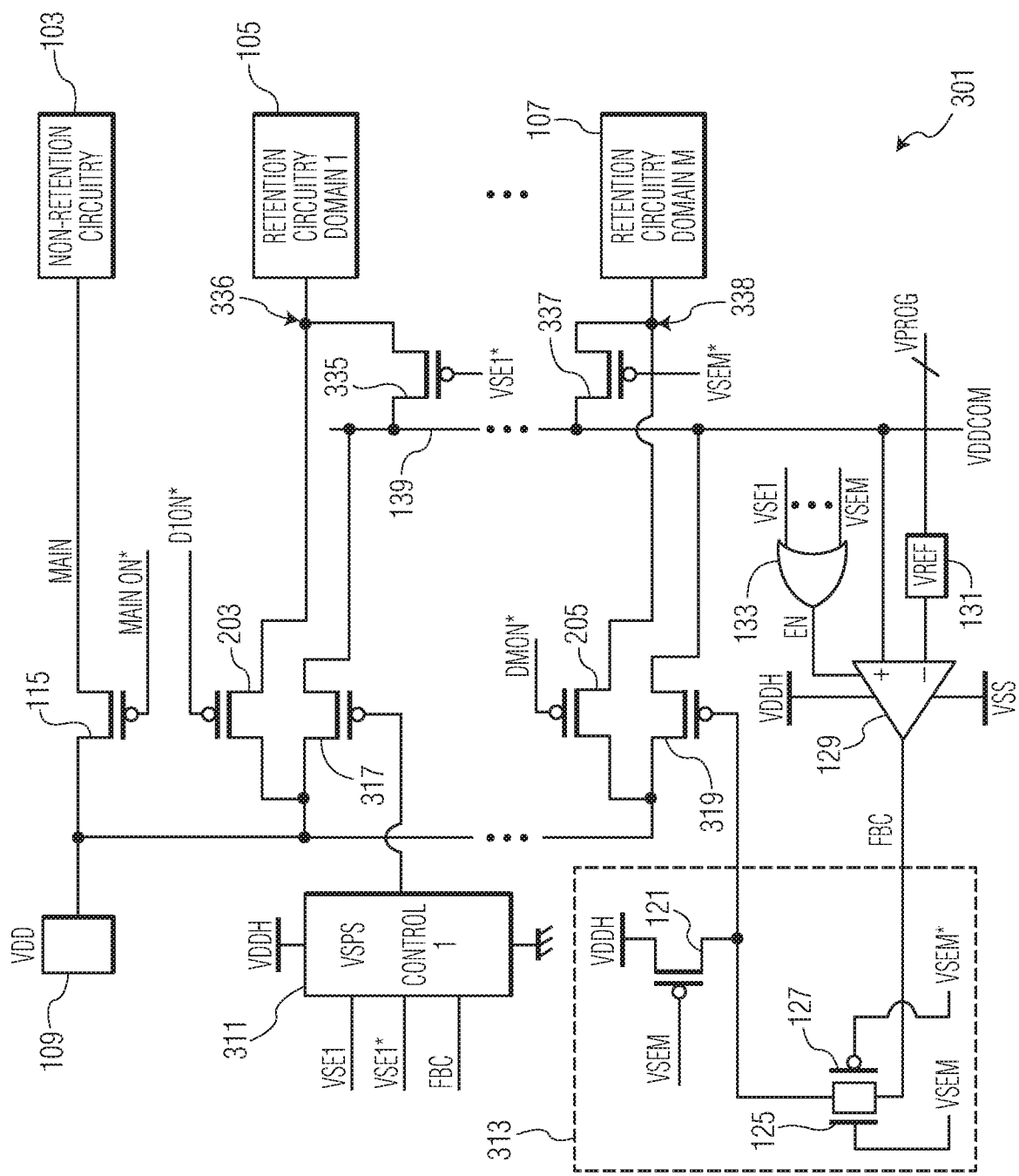
FIG. 3 is a circuit diagram of an integrated circuit according to another embodiment of the present invention.

FIG. 3 is a circuit diagram of an integrated circuit according to another embodiment of the present invention. The items in FIG. 3 having the same numbers are similar to the corresponding items in FIGS. 1 and 2. Also, not shown in FIG. 3 is a power controller similar to power controller 108.

A major difference between integrated circuit 301 of FIG. 3 and integrated circuit 201 of FIG. 2 is that the voltage scaling power switches 317 and 319 of integrated circuit 301 are connected to, and supply power to the common VDD voltage rail 139 during voltage scaling modes of their respective circuitry domains (105 and 107) instead of supplying power directly to the supply input terminals (336, 338) of their respective circuitry domains as with the embodiments of FIGS. 1 and 2. When domain 105 is in a voltage scaling mode, supply input terminal 336 of domain 105 is coupled to common rail 139 by a conductive transistor 335 to receive power at a scaled voltage. Transistor 335 is made conductive by an asserted low VSE1* signal provided to its gate from a power controller (not shown). When domain 107 is in a voltage scaling mode, supply input terminal 338 of domain 107 is coupled to common rail 139 by a conductive transistor 337 to receive power at a scaled voltage. Transistor 337 is made conductive by an asserted low VSEM* signal provided to its gate from a power controller (not shown).

Because voltage scaling power switches 317 and 319 are only conducive during voltage scaling modes of their respective power domains (105 and 107), VSPS control circuits 311 and 313 are not responsive to on mode signals (D1ON, DMON) or off mode signals (D1OFF*, DMOFF*). When not in a voltage scaling mode, transistor 121 is conductive to pull the voltage of the control input of switch 319 high (VDDH) to turn off switch 319.

In the embodiment shown, voltage scaling power switches 119 and 117 are used for supplying retention circuitry domains in a voltage scaling mode when at least part of integrated circuit 101 is in a low power mode where non-retention circuitry 103 is turned off or other non-retention circuitry similar to circuity 103 is turned off. In other embodiments, integrated circuit 101 can be in a normal operating mode when domains 105 and 107 are in a voltage scaling mode. In one example of such an embodiment, non-retention circuitry 103 is also powered by a voltage scaling power switch (not shown) and the power terminal input 110 of circuitry 103 is connected to common rail 139 by a coupling transistor (not shown) when circuitry 103 is operating in a voltage scaling mode during normal operation of integrated circuit 101.

In one embodiment, a circuit includes a first power supply terminal, a first circuit portion including a first power input node, a second circuit portion including a second power input node, a first voltage scaling power switch including a first current electrode coupled to the first power supply terminal and a second current electrode, a second voltage scaling power switch including a first current electrode coupled to the first power supply terminal and a second current electrode, and a common power rail. The circuit is configured to couple the common power rail to the first power input node during a voltage scaling mode of the first circuit portion and to the second power input node during a voltage scaling mode of the second circuit portion. The circuit includes a feedback circuit including a first input coupled to the common power rail, a second input coupled to a reference voltage circuit, and an output configured to provide a feedback control signal based on a comparison between a voltage on the common power rail and a reference voltage of the reference voltage circuit. The circuit includes a first voltage scaling control circuit corresponding to the first circuit portion and configured to provide the feedback control signal to a control input of the first voltage scaling power switch to provide a regulated voltage at the second current electrode of the first voltage scaling power switch for the first circuit portion during a voltage scaling mode of the first circuit portion. The circuit includes a second voltage scaling control circuit corresponding to the second circuit portion and configured to provide the feedback control signal to the control input of the second voltage scaling power switch to provide a regulated voltage at the second current electrode of the second voltage scaling power switch for the second circuit portion during a voltage scaling mode of the second circuit portion.

In another embodiment, a circuit includes a first power supply terminal, a first circuit portion including a first power input node, a second circuit portion including a second power input node, a first voltage scaling power switch including a first current electrode coupled to the first power supply terminal and a second current electrode, a second voltage scaling power switch including a first current electrode coupled to the first power supply terminal and a second current electrode, and a common power rail. The circuit includes a feedback circuit including a first input coupled to the common power rail, a second input coupled to a reference voltage circuit, and an output configured to provide a feedback control signal based on a comparison between a voltage on the common power rail and a reference voltage of the reference voltage circuit. The circuit includes a first switch including a first current electrode coupled to the common power rail and a second current electrode coupled to the first power input node. The first switch is configured to, during a voltage scaling mode of the first circuit portion, connect the common power rail to the first power input node via the first switch. The circuit includes a second switch including a first current electrode coupled to the common power rail and a second current electrode coupled to the second power input node. The second switch is configured to, during the voltage scaling mode of the second circuit portion, connect the common power rail to the second power input node via the second switch. The first voltage scaling power switch is configured to regulate a voltage for providing power for the first circuit portion in response to the feedback control signal during a voltage scaling mode of the first circuit portion, and is configured to be in an off state when the first circuit portion is an off mode. The second voltage scaling power switch is configured to regulate a voltage for providing power for the second circuit portion in response to the feedback control signal during a voltage scaling mode of the second circuit portion, and is configured to be in an off state when the second circuit portion is an off mode.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A circuit comprising:
   a first power supply terminal;
   a first circuit portion including a first power input node;
   a second circuit portion including a second power input node;
   a first voltage scaling power switch including a first current electrode coupled to the first power supply terminal and a second current electrode;
   a second voltage scaling power switch including a first current electrode coupled to the first power supply terminal and a second current electrode;
   a common power rail, wherein the circuit is configured to couple the common power rail to the first power input node during a voltage scaling mode of the first circuit portion and to the second power input node during a voltage scaling mode of the second circuit portion;
   a feedback circuit including a first input coupled to the common power rail, a second input coupled to a reference voltage circuit, and an output configured to provide a feedback control signal based on a comparison between a voltage on the common power rail and a reference voltage of the reference voltage circuit;
   a first voltage scaling control circuit corresponding to the first circuit portion and configured to provide the feedback control signal to a control input of the first voltage scaling power switch to provide a regulated voltage at the second current electrode of the first voltage scaling power switch for the first circuit portion during a voltage scaling mode of the first circuit portion; and
   a second voltage scaling control circuit corresponding to the second circuit portion and configured to provide the feedback control signal to the control input of the second voltage scaling power switch to provide a regulated voltage at the second current electrode of the second voltage scaling power switch for the second circuit portion during a voltage scaling mode of the second circuit portion.

2. The circuit of claim 1, wherein:
   the first voltage scaling control circuit includes a first switch configured to provide the feedback control signal to the control input of the first voltage scaling power switch during a voltage scaling mode of the first circuit portion and to isolate the feedback control signal from the control input of the first voltage scaling power switch when the first circuit portion is not in a voltage scaling mode, and
   the second voltage scaling control circuit includes a second switch configured to provide the feedback control signal to the control input of the second voltage scaling power switch during a voltage scaling mode of the second circuit portion and to isolate the feedback control signal from the control input of the second voltage scaling power switch when the second circuit portion is not in a voltage scaling mode.

3. The circuit of claim 1, wherein:
   when the first circuit portion is not in a voltage scaling mode, the first voltage scaling control circuit is configured to:
      turn on the first voltage scaling power switch when the first circuit portion is in a full voltage mode to provide a voltage from the first power supply terminal to the first power input node via the first voltage scaling power switch, and
      turn off the first voltage scaling power switch when the first circuit portion is in an off mode, and
   when the second circuit portion is not in a voltage scaling mode, the second voltage scaling control circuit is configured to:
      turn on the second voltage scaling power switch when the second circuit portion is in a full voltage mode to provide a voltage from the first power supply terminal to the second power input node via the second voltage scaling power switch, and
      turn off the second voltage scaling power switch when the second circuit portion is in an off mode.

4. The circuit of claim 3, wherein:
   during a voltage scaling mode of the first circuit portion, the first voltage scaling power switch operates in a saturation mode and during a full voltage mode of the first circuit portion, the first voltage scaling power switch operates in linear mode; and
   during the voltage scaling mode of the second circuit portion, the second voltage scaling power switch operates in a saturation mode and during a full voltage mode of the second circuit portion, the second voltage scaling power switch operates in a linear mode.

5. The circuit of claim 1, wherein when the first circuit portion is not in a voltage scaling mode, the feedback circuit and the common power rail are isolated from the first power input node and when the second circuit portion is not in a voltage scaling mode, the feedback circuit and the common power rail are isolated from the second power input node.

6. The circuit of claim 5, further comprising:
a first switch including a first current electrode coupled to the common power rail and a second current electrode coupled to the first power input node wherein the first switch is configured to, during a voltage scaling mode of the first circuit portion, connect the common power rail to the first input power node via the first switch; and
a second switch including a first current electrode coupled to the common power rail and a second current electrode coupled to the second power input node wherein the second switch is configured to, during a voltage scaling mode of the second circuit portion, connect the common power rail to the second input power node via the second switch.

7. The circuit of claim 6, further comprising:
a first power switch including a first current electrode coupled to the first power supply terminal and a second current electrode coupled to the first power input node and configured to be off during a voltage scaling mode of the first circuit portion, wherein:
the first switch is configured to, during a voltage scaling mode of the first circuit portion, connect the second current electrode of the first voltage scaling power switch to the first power input node via the first switch.

8. The circuit of claim 7, wherein:
when the first circuit portion is not in a voltage scaling mode but in a full voltage mode, the first voltage scaling power switch is off and the first power switch is on such that a voltage from the first power supply terminal is provided to the first power input node via the first power switch;
wherein when the first circuit portion is not in the voltage scaling mode but in an off mode, the first voltage scaling power switch is off and the first power switch is off.

9. The circuit of claim 1, further comprising:
a first power switch including a first current electrode coupled to the first power supply terminal and a second current electrode coupled to the first power input node and configured to be off during a voltage scaling mode of the first circuit portion and to be on during a full voltage mode of the first circuit portion;
a second power switch including a first current electrode coupled to the first power supply terminal and a second current electrode coupled to the second power input node and configured to be off during a voltage scaling mode of the second circuit portion and to be on during a full voltage mode of the second circuit portion.

10. The circuit of claim 1 wherein:
the first voltage scaling control circuit provides a first voltage to the control input of the first voltage scaling power switch to turn off the first voltage scaling power switch;
the second voltage scaling control circuit provides the first voltage to the control input of the second voltage scaling power switch to turn off the second voltage scaling power switch;

the first voltage is a higher voltage than a voltage of the first power supply terminal.

11. A circuit comprising:
a first power supply terminal;
a first circuit portion including a first power input node;
a second circuit portion including a second power input node;
a first voltage scaling power switch including a first current electrode coupled to the first power supply terminal and a second current electrode;
a second voltage scaling power switch including a first current electrode coupled to the first power supply terminal and a second current electrode;
a common power rail;
a feedback circuit including a first input coupled to the common power rail, a second input coupled to a reference voltage circuit, and an output configured to provide a feedback control signal based on a comparison between a voltage on the common power rail and a reference voltage of the reference voltage circuit;
a first switch including a first current electrode coupled to the common power rail and a second current electrode coupled to the first power input node wherein the first switch is configured to, during a voltage scaling mode of the first circuit portion, connect the common power rail to the first power input node via the first switch; and
a second switch including a first current electrode coupled to the common power rail and a second current electrode coupled to the second power input node wherein the second switch is configured to, during the voltage scaling mode of the second circuit portion, connect the common power rail to the second power input node via the second switch; and
wherein:
the first voltage scaling power switch is configured to regulate a voltage for providing power for the first circuit portion in response to the feedback control signal during a voltage scaling mode of the first circuit portion, and is configured to be in an off state when the first circuit portion is an off mode, and
the second voltage scaling power switch is configured to regulate a voltage for providing power for the second circuit portion in response to the feedback control signal during a voltage scaling mode of the second circuit portion, and is configured to be in an off state when the second circuit portion is an off mode.

12. The circuit of claim 11, further comprising:
a third switch configured to provide the feedback control signal to a control input of the first voltage scaling power switch during a voltage scaling mode of the first circuit portion; and
a fourth switch configured to provide the feedback control signal to a control input of the second voltage scaling power switch during a voltage scaling mode of the second circuit portion.

13. The circuit of claim 12, wherein the third switch is configured to isolate the feedback control signal from the control input of the first voltage scaling power switch when the first circuit portion is not in a voltage scaling mode, and the fourth switch is configured to isolate the feedback control signal from the control input of the second voltage scaling power switch when the second circuit portion is not in a voltage scaling mode.

14. The circuit of claim 11, wherein when the first circuit portion is not in a voltage scaling mode, the first switch disconnects the common power rail from the first power input node, and when the second circuit portion is not in a voltage scaling mode, the second switch disconnects the common power rail from the second power input node.

15. The circuit of claim 11, wherein the second current electrode of the first voltage scaling power switch is coupled to the first power input node via the common power rail and the first switch when the first circuit portion is in a voltage scaling mode, and second current electrode of the second voltage scaling power switch is coupled to the second power input node via the common power rail and the second switch when the second circuit portion is in a voltage scaling mode.

16. The circuit of claim 15, further comprising:
a first power switch including a first current electrode coupled to the first power supply terminal and a second current electrode coupled to the first power input node and configured to be off during a voltage scaling mode of the first circuit portion;
a second power switch including a first current electrode coupled to the first power supply terminal and a second current electrode coupled to the second power input node and configured to be off during a voltage scaling mode of the first circuit portion.

17. The circuit of claim 16, wherein when the first circuit portion is not in the voltage scaling mode but in a full voltage mode, the first voltage scaling power switch is off and the first power switch is on such that a voltage from the first power supply terminal is provided to the first power input node via the first power switch.

18. The circuit of claim 11, wherein:
when the first circuit portion is not in the voltage scaling mode but in a full voltage mode, the first voltage scaling power switch is configured to be on such that a voltage from the first power supply terminal is provided to the first power input node via the first voltage scaling power switch; and
when the second circuit portion is not in the voltage scaling mode but in a full voltage mode, the second voltage scaling power switch is configured to be on such that the voltage from the first power supply terminal is provided to the second power input node via the second voltage scaling power switch.

19. The circuit of claim 18, wherein:
during a voltage scaling mode of the first circuit portion, the first voltage scaling power switch operates in a saturation mode and during a full voltage mode of the first circuit portion, the first voltage scaling power switch operates in linear mode; and
during the voltage scaling mode of the second circuit portion, the second voltage scaling power switch operates in a saturation mode and during a full voltage mode of the second circuit portion, the second voltage scaling power switch operates in linear mode.

20. The circuit of claim 11, further comprising:
a first power switch including a first current electrode coupled to the first power supply terminal and a second current electrode coupled to the first power input node, the first power switch is configured to be off during a voltage scaling mode of the first circuit portion, the first power switch is configured to be on during a full voltage mode of the first circuit portion such that a voltage from the first power supply terminal is provided to the first power input node via the first power switch;
a second power switch including a first current electrode coupled to the first power supply terminal and a second current electrode coupled to the second power input node, the second power switch is configured to be off during a voltage scaling mode of the second circuit portion, the second power switch is configured to be on during a full voltage mode of the second circuit portion such that a voltage from the first power supply terminal is provided to the second power input node via the second power switch.

* * * * *